United States Patent [19]

Harding et al.

[11] Patent Number: 5,197,077
[45] Date of Patent: Mar. 23, 1993

[54] LOW DIVERGENCE LASER

[75] Inventors: Charlton M. Harding, Lake Peekskill; Ying-Chih Chen, Scarsdale; Richard J. Dalby, Peekskill; Robert G. Waters, Highland Falls, all of N.Y.

[73] Assignee: McDonnell Douglas Corporation, St. Louis, Mo.

[21] Appl. No.: 843,018

[22] Filed: Feb. 28, 1992

[51] Int. Cl.⁵ .................................................. H01S 3/19
[52] U.S. Cl. ......................................... 372/45; 372/46
[58] Field of Search ........................ 372/45, 46, 97, 43

[56] References Cited

U.S. PATENT DOCUMENTS 4,955,030  9/1990  Menigaux et al. ................... 372/45
5,040,186  8/1991  Logan et al. ......................... 372/45

FOREIGN PATENT DOCUMENTS 0181084  10/1984  Japan ................................... 372/45
0083389   5/1985  Japan ................................... 372/45
0257781  11/1987  Japan ................................... 372/45

OTHER PUBLICATIONS

Katz et al., "Large Optical Cavity AlGaAs Injection Lasers with Multiple Active Regions," J. Appl. Phys 51(8), Aug. 1980, pp. 4038–4041.

Primary Examiner—Georgia Y. Epps
Attorney, Agent, or Firm—Guy R. Gosnell; Benjamin Hudson, Jr.; Timothy H. Courson

[57] ABSTRACT

A semiconductor ridge diode laser, capable of providing a single mode, high power laser output having a low divergence in the far field, comprised of a plurality of semiconductor layers having three quantum wells therein. The layers of the diode laser are doped such that the PN junction occurs in or near the center quantum well. A pair of graded index layers surround each quantum well to provide transverse optical confinement. In addition to linear grading of the index of refraction in the graded index layers, stepped changes in the index of refracton or other profile types changes such as a parabolic grading may also be used. The P-side of the diode laser is etched to form a ridge with which electrical contact may be maintained to confine the optical signals laterally. Such semiconductor laser structures with the depth of the PN junction an appropriate transverse distance from the bottom surface of the ridge such that current supplied may spread have an increase in emission spot size in the near field and a decrease in the far field divergence in both the transverse and the lateral direction. The spacing and the width of the quantum wells must be such that the emission spot size in the transverse direction is increased so as to decrease the divergence in the transverse direction while allowing sufficient optical coupling and operation of the fundamental transverse mode while suppressing higher order modes.

10 Claims, 1 Drawing Sheet

LOW DIVERGENCE LASER

BACKGROUND OF THE INVENTION

This invention relates generally to semiconductor diode lasers and more particularly to semiconductor ridge waveguide diode laser exhibiting low divergence and single mode operation.

In numerous applications, it is desirable to have an output from a semiconductor laser to have a low divergence both in the lateral direction as well as the transverse direction. Typical uses for such low divergence semiconductor diode outputs include free space optical communication, fiber coupled optical communication, and use as an optical source for pumping solid state lasers. In prior semiconductor laser devices which have been designed to have a relatively high output power as well as a single mode output, the divergence of the output beam emitted from the emitting facet has been quite large. A typical far-field divergence of a single mode semiconductor device is typically 50° in the transverse direction and 7° in the lateral direction as shown in an article entitled, "High Power 0.98 μm GaInAs Strained Quantum Well Lasers for ER$_{3+}$-Doped Fiber Amplifier" published in Electronics Letters, Volume 25, pages, 1563-1564 in 1989 by Akyasu, et al.

Various laser diode configurations comprised of semiconductor layers of GaAs/AlGaAs have been designed in order to produce relatively high power outputs with single mode operation. Such configurations have included the buried heterostructure laser, the distributed feedback laser, the distributed Bragg reflector laser, and the ridge waveguide laser. However, all such prior devices while achieving relatively high output power levels in single mode operation suffered from fairly large divergence angles. While Welsh, et al reported in an article entitled, "High Reliability, High Power, Single Mode Laser Diodes" in Electronics Letters, Volume 26, pages 1481-1483 in 1990 that they had been able to reduce transverse divergence to approximately 22°, significant reductions of the divergence of the laser's output in both the transverse and the lateral directions have not yet been accomplished.

The far-field divergence of a semiconductor laser diode is a measurement of the extent of spread of the light beam as the beam moves away from the emitting facet of the laser into free space. The far-field divergence is measured in two directions at the full width half maximum of the radiation pattern and is expressed in degrees. The full width half maximum of the radiation pattern is a measurement taken, in the far-field in this instance, of the total angular divergence between points in space at which the power level of the radiated light is one half the maximum value radiated in that plane in space. The full width half maximum of the radiation pattern is measured in two directions both perpendicular (or transverse) to the PN junction of the semiconductor device and parallel (or lateral) with the PN junction. A reduction in the far-field divergence is desirable as such a reduction would enable more emitted light to be collected by a lens system or an optical fiber as the radiated light would be less diverse. Thus, by allowing more light to be collected by a lens system, or an optical fiber, the efficiency of an optical communications system can be greatly improved as less emitted light from the semiconductor laser diode would be lost.

Therefore, it would be desirable for a semiconductor diode laser to produce a high power, single mode output while achieving low divergence. It would furthermore be desirable that such divergence be decreased in both the transverse and lateral directions in the far-field.

SUMMARY

Figure 1:
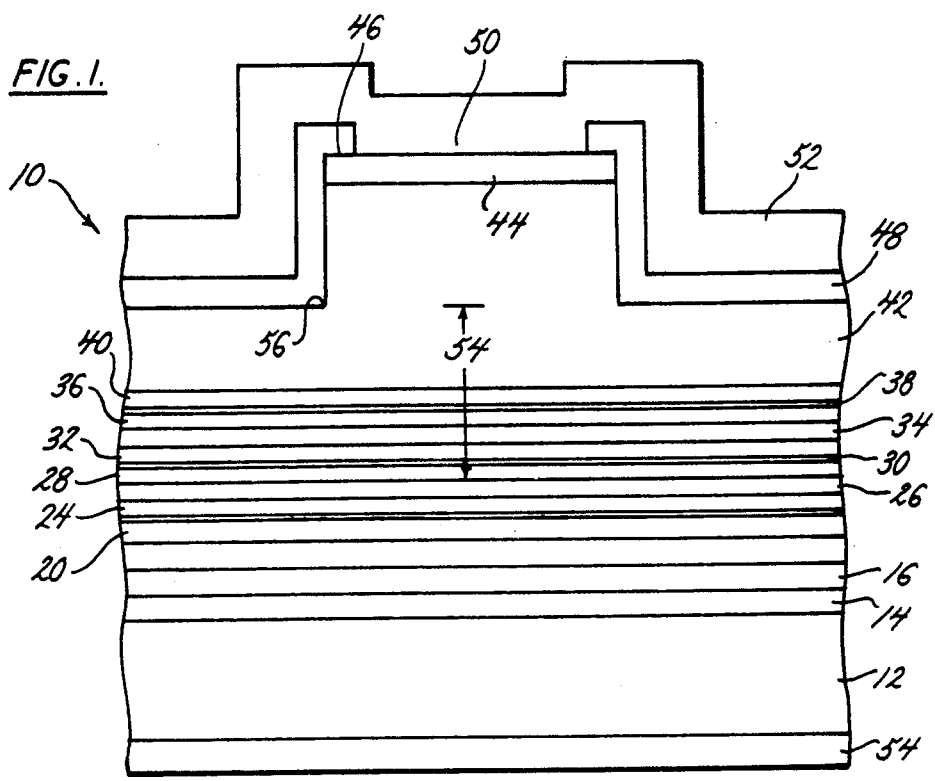
FIG. 1 is a cross sectional view of the semiconductor ridge waveguide diode laser incorporating the principles of this invention.

There is provided by this invention a semiconductor ridge diode laser capable of providing a single mode, high power laser output having a low divergence in the far field. This semiconductor diode laser is comprised of a plurality of semiconductor layers. Such plurality of semiconductor layers may be comprised of any of a variety of semiconductor materials, however, a GaAs/AlGaAs material system is typically utilized.

the plurality of semiconductor layers are formed to have three quantum wells therein. The layers of the diode laser are doped such that the PN junction occurs in or near the center quantum well. A pair of graded index layers surround each quantum well to provide transverse optical confinement since the index of refraction is the largest in the quantum well.

The P-side of the diode laser is subsequently etched to form a ridge or mesa with which electrical contact may be maintained. The ridge structure provides a waveguide to confine the optical signals laterally.

The quantum wells are also typically comprised of GaAs, although AlGaAs, InGaAs or InAlGaAs may be utilized, while the graded index layers are typically comprised of $Al_xGa_{1-x}As$ in which the percentage of aluminum, typically varies between 0.6 and 0.3 although higher and lower concentrations may be used for different applications. The minimum aluminum concentration occurs at the interface of each graded index layer and its associated quantum well and the maximum aluminum percentage occurs at the interface at the graded index layer and its adjacent confinement or spacer layer with approximately a linear change in the aluminum percentage between the two interfaces. In addition to linear grading of the index of refraction in the graded index layers, stepped changes in the index of refraction or other profile types changes such as a parabolic grading may also be used.

Semiconductor laser structures having such a triple quantum well structure with the depth of the PN junction or central quantum well an appropriate transverse distance from the bottom surface of the ridge, such as 2 μm, such that current supplied through the metallic contact on the ridge may spread have an increase in the emission spot size in the near field. By so increasing the emission spot size, the far field divergence of the laser is decreased in both the transverse and the lateral direction. Additionally, the spacing and the width of the quantum wells must be such that the emission spot size in the transverse direction is increased so as to decrease the divergence in the transverse direction while allowing sufficient optical coupling and operation of the fundamental transverse mode while suppressing higher order modes.

Semiconductor diode lasers incorporating the principles of this invention have produced relatively high output power light beams having a single mode with a transverse divergence of 21° and a lateral divergence of 3.5° as measured at the full width half maximum point in the far field.

DETAILED DESCRIPTION OF THE PREFERRED EMBODIMENT

Referring to FIG. 1, there is shown a cross-sectional view of the semiconductor layers forming the ridge waveguide diode laser 10 of the present invention. While the structure may have varied physical dimensions and may be comprised of various materials as required by the particular application as is well known to those skilled in the art, the GaAs/AlGaAs semiconductor structure shown in FIG. 1 will be described in more detail for exemplary purposes. The ridge waveguide diode laser structure 10 is typically grown via metalorganic chemical vapor deposition (MOCVD) although such semiconductor layers could be fabricated using other well known semiconductor deposition processes.

The ridge waveguide diode laser structure 10 shown in FIG. 1 is fabricated upon a silicon doped GaAs substrate 12 upon which an N-doped GaAs buffer layer 14 is deposited. Upon the N-doped GaAs buffer layer 14 is deposited an N-doped $Al_{.15}Ga_{.85}As$ buffer layer 16 and a N-doped $Al_{.6}Ga_{.4}As$ confinement layer 18. Upon the $Al_{.6}Ga_{.4}As$ confinement layer 18 is deposited a first graded index layer 20. This first graded index layer 20 is comprised of $Al_xGa_{1-x}As$ in which the percentage concentration of aluminum is decreased from 0.6 at its interface of the $Al_{.6}Ga_{.4}As$ confinement layer 18 to a minimum of 0.3. Upon the first graded index layer 20 is deposited the first quantum well 22 having a thickness of approximately 50 angstroms. Upon this first quantum well 22 is deposited a second graded index layer 24 comprised of $Al_xGa_{1-x}As$ in which the percentage of Al increases from 0.3 at the interface of the first quantum well 22 and the second graded index layer 24 to a maximum of 0.6. A first spacer layer 26 comprised of $Al_{.6}Ga_{.4}As$ is deposited upon the second graded index layer 24. Both this first spacer layer 26 and the first and second graded index layers 20 and 24 are nonminally N-doped. Upon this first spacer layer 20 is deposited a third graded index layer 28 comprised of $Al_xGa_{1-x}As$ in which the percentage of aluminium decreases from 0.6 at the interface of the first quantum well 22 and the third graded index layer 28 to a minimum of 0.3. Upon this third graded index layer 28 is deposited the second and the central quantum well 30 having a thickness of approximately 100 angstroms. A fourth graded index layer 32 is deposited in turn. This fourth graded index layer 32 is comprised of P-doped $Al_xGa_{1-x}As$ in which the percentage concentration of aluminum varies from a minimum of 3.0 at the interface at the second quantum well 30 to a maximum of 0.6. Upon this fourth graded index layer 32 is deposited a second spacer layer 34 comprised of P-doped $Al_{.6}Ga_{.4}As$ on which a P-doped fifth graded index layer 36 comprised of $Al_xGa_{1-x}As$ is deposited in which the percentage concentration of aluminum varies from a maximum 0.6 at the interface of the second spacer layer 34 and the fifth graded index layer 36 to a minimum of 0.3. Upon this fifth graded layer 36 is deposited the third quantum well 38 having a thickness of approximately 50 angstroms. Upon the third quantum well 38 is deposited the sixth graded index layer 40 comprised of P-doped $Al_xGa_{1-x}As$ in which the percentage of aluminum increases from a minimum of 0.3 at the interface at the third quantum well 38 and the sixth graded index layer 40 to a maximum of 0.6. The first, second and third quantum well structures are comprised of undoped GaAs although AlGaAs, InGaAs or InAlGaAs could also be used. Upon this sixth graded index layer 40 is deposited a P-doped $Al_{.6}Ga_{.4}As$ confinement layer 42 upon which a P-doped GaAs cap layer 44 is deposited. While the particular dopants may be any of those typically utilized by those skilled in the art, exemplary dopants include an N-type dopant of selenium and a P-type dopant of zinc.

Figure 2:
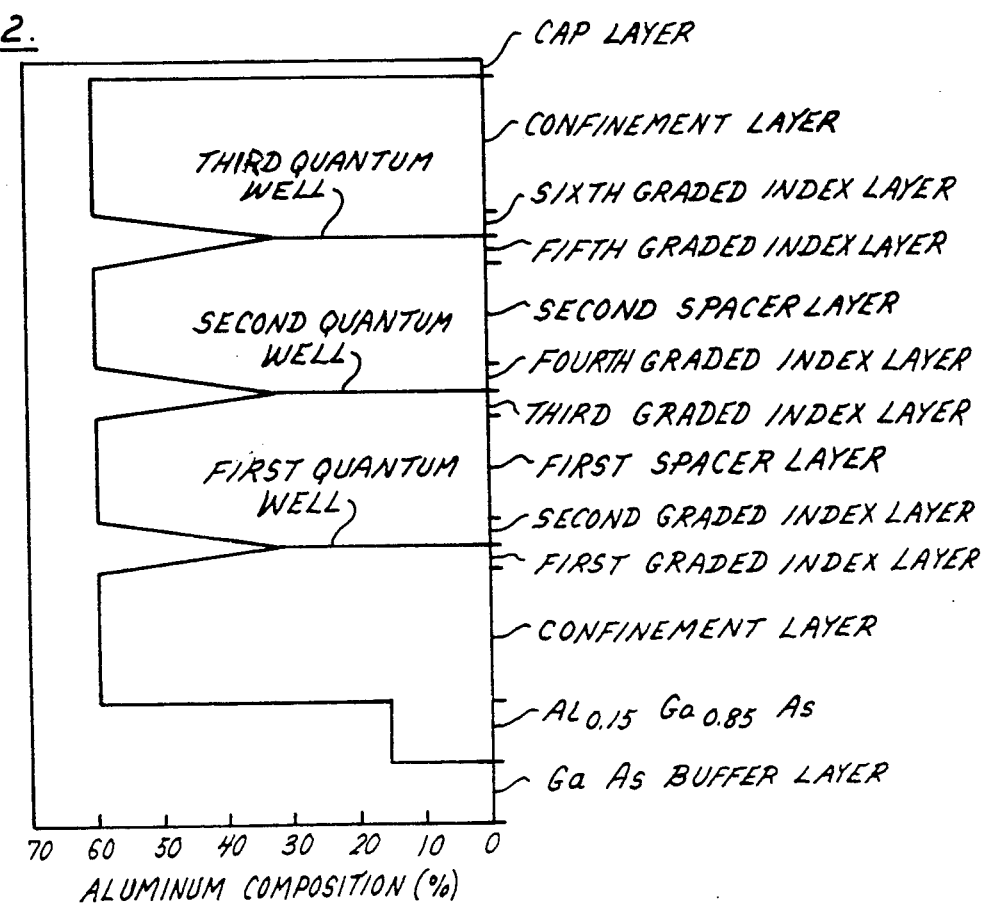
FIG. 2 is a chart illustrating the aluminum composition of the various semiconductor layers forming the ridge waveguide laser at various points within the structure.

FIG. 2 illustrates the aluminum percentage in the various layers of the previously described semiconductor structure such as the graded index layers and the spacer layers. The maximum index of refraction occurs within the quantum well.

Following the deposition of the various semiconductor layers previously discussed, the ridge waveguide diode laser 10 is fabricated by etching a mesa 46 to serve as an optical waveguide. While the etching may be done using any of the photolithographic processes well known to those skilled in the art chemically assisted ion beam etching (CAIBE) may be utilized. Following the etching a silicon dioxide layer 48 is deposited on the etched surface of the wafer. Subsequently, a second etch is done to open a strip 50 along the center of the mesa 46. This second etch should be deep enough so that the P-doped cap layer 44 is exposed in the stripe region 50. Subsequently, the ridge waveguide diode laser is metalized by depositing titanium/platinum/gold layer 52 on the etched surface of the device and a gold/germanium/nickel layer 54 on the exposed surface of the substrate 12. Following this metalization, the devices are cleaved into bars which are optically coated. The back facet of the ridge waveguide diode laser is coated with a high reflectance film such as a six layer stack of alternating quarter wave thick layers of silicon and aluminum oxide. The emitting facet is coated with an antireflection coating such as a quarter wave thick coating of zirconium oxide.

As is well known to those skilled in the art, the buffer layers previously discussed serve to ease the transition of the material forming the semiconductor but are not necessary for the proper functioning of the diode laser. Thus, the semiconductor diode laser can be fabricated with the omission of the N-doped GaAs buffer layer 14 and the N-doped $Al_{.15}Ga_{.85}As$ buffer layer 16. Additionally, the particular percentages of Al and Ga specified heretofore are for purposes of example and may be varied as desired in the particular application.

While the physical device dimensions may be selected so as to be appropriate for the particular application of the device, the depth 54 of the PN junction which occurs in the central quantum well 30 must be a sufficient distance below the base 56 of the ridge such that the current supplied through the metalization layers to the ridge is allowed to spread before reaching the PN junction. This spreading is necessary to increase the emission spot size on the emitting facet in the parallell (or lateral) direction. The emission spot size is a measure of the height and width of the emitted light. Additionally, the spacing and the width of each of the three quantum wells may be varied, however, the three wells must be spaced so that sufficient optical coupling results between the three wells. Additionally, the quantum well width and spacing must be tailored to increase the emidssion spot size in the transverse (or prependicular) direction and to force the operation of the fundamental transverse mode while suppressing higher order modes as is well known to those skilled in the art.

As an example, the ridge waveguide diode laser may have a distance from the base 56 of the ridge to the PN junction of approximately two micrometers with the spacings between both the first and the second well and the second and the third well being approximately 1 micrometer.

In order to verify the decrease in output divergence of the ridge waveguide diode laser, a low divergence laser was constructed having a ridge four micrometers wide by 600 micrometers long and having a stripe width of two micrometers opened in the silicon dioxide layer on the top of the ridge. The measured divergence of the aforementioned low divergence laser in the far field was 21° in the transverse direction by 3.5° in the lateral direction. Such decrease in the divergence is attributed in part to the increase of the emission spot size which was measured in the aforementioned laser as having, in the lateral direction, a full width half maximum approximately 8 micrometers in the near field. This 8 micrometer measurement is in comparison to typical 4 micrometer full width half maximum near field measurements for ridge waveguide lasers fabricated having a single quantum well graded index structure. Additionally, the low divergence laser maintained single mode operation and produced relatively high output power levels such as 100 milliwatts. While the use of particular materials and processes have been previously discussed, use of alternative materials or processes for constructing the semiconductor laser as may be readily apparent for those skilled in the art is also within the scope of this invention.

Although there has been illustrated and described specific detail and structure of operations, it is clearly understood that the same were merely for purposes of illustration and that changes and modifications may be readily made therein by those skilled in the art without departing from the spirit and the scope of this invention.

What is claimed is:

1. A semiconductor laser diode, comprising:
   (a) a semiconductor substrate;
   (b) a plurality of semiconductor layers, positioned upon said semiconductor substrate, comprising:
   (1) a center quantum well for propagating optical signals along an axis of propagation, said center quantum well having a PN junction proximate thereto;
   (2) first and second quantum wells symmetrically disposed about said center quantum well for propagating optical signals along an axis of propagation; and
   (3) a plurality of semiconductor layers having a graded index of refraction, said graded index layers disposed adjacent to each of said quantum wells such that the propagating optical signals within each of said quantum wells are confined in a direction transverse to said axes of propagation;
   (c) a ridge structure formed upon said plurality of semiconductor layers for providing confinement to said propagating optical signals in a direction lateral to said axes of propagation, said ridge structure having an upper mesa and a base; and
   (d) a means for supplying electrical current between said upper mesa of said ridge structure and said substrate such that optical signals will be propagated within each of said quantum wells; wherein the transverse distance between said PN junction and said base of said ridge structure is sufficient to allow significant spreading of said electrical current.

2. A semiconductor laser diode as recited in claim 1, wherein said plurality of semiconductor layers are comprised of alloys of $Al_xGa_{1-x}As$ wherein x varies from 0 to 1.0.

3. A semiconductor laser diode as recited in claim 1, wherein said central quantum well and said first and second quantum wells are comprised of a material selected from the group consisting of GaAs, AlGaAs, InGaAs, and InAlGaAs.

4. A semiconductor laser diode as recited in claim 1, wherein said transverse distance between said PN junction and said base of said ridge structure is approximately 2 μml.

5. A semiconductor laser diode as recited in claim 1, wherein the transverse distances between said first quantum well and said center quantum well and between said second quantum well and said center quantum well are substantially equal.

6. A semiconductor laser diode as recited in claim 5, wherein said transverse distances between said first quantum well and said center quantum well and between said second quantum well and said center quantum well are each approximately 1 μm.

7. A semiconductor laser diode as recited in claim 1, wherein the width of said center quantum well is approximately 100 Angstroms.

8. A semiconductor laser diode as recited in claim 7, wherein the width of each of said first and second quantum wells are substantially equal.

9. A semiconductor laser diode as recited in claim 8, wherein the width of each of said first and second quantum wells are 50 Angstroms.

10. A semiconductor laser diode, comprising:
    (a) a semiconductor substrate comprised of GaAs;
    (b) a plurality of semiconductor layers comprised of alloys of $Al_xGa_{1-x}As$ wherein x varies from 0 to 1.0, positioned upon said semiconductor substrate, comprising:
    (1) a center quantum well for propagating optical signals along an axis of propagation, said center quantum well having a PN junction proximate thereto and a width of approximately 100 Angstroms;
    (2) first and second quantum wells symmetrically disposed about said center quantum well for propagating optical signals along an axis of propagation, each of said first and second quantum wells having a width of approximately 50 Angstroms and positioned approximately 1 μm in a direction transverse to said axes of propagation from said center quantum well; and
    (3) a plurality of semiconductor layers having a graded index of refraction, said graded index layers disposed adjacent to each of said quantum wells such that the propagating optical signals within each of said quantum wells are confined in a direction transverse to said axes of propagation;
    (c) a ridge structure formed upon said plurality of semiconductor layers for providing confinement to said propagating optical signals in a direction lateral to said axes of propagation, said ridge structure having an upper mesa and a base; and (d) a means for supplying electrical current between said upper mesa of said ridge structure and said substrate such that optical signals will be propagated within each of said quantum wells; wherein the transverse distance between said PN junction and said base of said ridge structure is approximately 2 μm.

* * * * *